United States Patent
Giesen et al.

(10) Patent No.: US 11,310,921 B2
(45) Date of Patent: Apr. 19, 2022

(54) BURIED VIA IN A CIRCUIT BOARD

(71) Applicant: INTERNATIONAL BUSINESS MACHINES CORPORATION, Armonk, NY (US)

(72) Inventors: Kyle Indukummar Giesen, Lagrangeville, NY (US); Matteo Cocchini, Long Island City, NY (US); Sylvain Pharand, St-Bruno-de-Montarville (CA)

(73) Assignee: International Business Machines Corporation, Armonk, NY (US)

( * ) Notice: Subject to any disclaimer, the term of this patent is extended or adjusted under 35 U.S.C. 154(b) by 280 days.

(21) Appl. No.: 16/660,861

(22) Filed: Oct. 23, 2019

(65) Prior Publication Data

US 2021/0127502 A1    Apr. 29, 2021

(51) Int. Cl.
  *H05K 3/46* (2006.01)
  *H05K 1/11* (2006.01)
  *H05K 3/42* (2006.01)

(52) U.S. Cl.
  CPC .......... *H05K 3/4614* (2013.01); *H05K 1/115* (2013.01); *H05K 3/429* (2013.01); *H05K 3/4632* (2013.01)

(58) Field of Classification Search
  CPC .......... H05K 1/115; H05K 2203/0415; H05K 2203/063; H05K 3/429; H05K 3/4614
  See application file for complete search history.

(56) References Cited

U.S. PATENT DOCUMENTS

| | | | |
|---|---|---|---|
| 5,811,736 A | 9/1998 | Lauffer et al. | |
| 6,504,111 B2 | 1/2003 | Curcio et al. | |
| 6,532,651 B1 | 3/2003 | Andou et al. | |
| 6,555,761 B2 | 4/2003 | Amir | |
| 6,812,412 B2 | 11/2004 | Obata et al. | |
| 7,547,577 B2 | 6/2009 | Card et al. | |
| 10,172,244 B1* | 1/2019 | Cocchini | H05K 3/4614 |
| 10,237,971 B2 | 3/2019 | Takagi et al. | |
| 2006/0166490 A1 | 7/2006 | Takashi | |
| 2009/0120916 A1 | 5/2009 | Bruce et al. | |
| 2009/0193652 A1* | 8/2009 | Salmon | G02B 6/43 29/831 |
| 2021/0127502 A1* | 4/2021 | Giesen | H05K 1/115 |

* cited by examiner

*Primary Examiner* — Minh N Trinh
(74) *Attorney, Agent, or Firm* — L. Jeffrey Kelly

(57) ABSTRACT

A method may include forming a plurality of multilayer cores wherein each multilayer core comprises a sheet of cured dielectric material having a layer of metal on each side of the sheet of cured dielectric material, patterning each layer of metal in the plurality of multilayer cores to form wiring traces in each layer of metal, embedding a solder element in at least one sheet of a plurality of sheets of uncured dielectric material, wherein the solder element having a melting point temperature within a temperature range of a curing temperature of the uncured dielectric material, forming a printed circuit board by alternately stacking the plurality of multilayer cores with the plurality of sheets of uncured dielectric material between each multilayer core, laminating the stack of multilayer cores and sheets of uncured dielectric material to cause curing of the sheets of uncured dielectric material and melting of the solder element.

15 Claims, 5 Drawing Sheets

BURIED VIA IN A CIRCUIT BOARD

BACKGROUND

The present invention relates generally to a printed circuit board, and more particularly, to a structure and a method of forming a printed circuit board having buried vias.

A multilayer printed circuit board may consist of many layers and vias. The layers may include dielectric layers and metal layers. The vias may provide an electrical current between layers in the printed circuit board. The printed circuit board may have both back and front metallization, typically referred to as circuit traces. In addition, the printed circuit board may include ground planes and other metallization structures.

To create a via, holes may be drilled into the printed circuit board and the internal walls may be electroplated or otherwise metallized. Basic types of vias for a printed circuit board may include through vias, blind vias, and buried vias. Through vias may extend fully between outer surfaces of the printed circuit board. The blind vias may penetrate from one outer surface of the printed circuit board to a specified depth in the printed circuit board stack and stop. The buried vias may exist only in the intermediate layers of the printed circuit board stack and are not accessible from the outer surfaces of the printed circuit board.

SUMMARY

According to one embodiment of the present invention, a method is provided. The method may include forming a plurality of multilayer cores wherein each multilayer core comprises a sheet of cured dielectric material having a layer of metal on each side of the sheet of cured dielectric material, patterning each layer of metal in the plurality of multilayer cores to form wiring traces in each layer of metal, embedding a solder element in at least one sheet of a plurality of sheets of uncured dielectric material, wherein the solder element having a melting point temperature within a temperature range of a curing temperature of the uncured dielectric material, forming a printed circuit board by alternately stacking the plurality of multilayer cores with the plurality of sheets of uncured dielectric material between each multilayer core, where at least one sheet of the uncured dielectric material having the embedded solder element positioned so as to be aligned with the wiring traces in adjacent layers of metal in adjacent multilayer cores, and laminating the stack of multilayer cores and sheets of uncured dielectric material to cause curing of the sheets of uncured dielectric material and melting of the solder element.

According to another embodiment of the present invention, a method is provided. The method may include forming a plurality of multilayer cores wherein each multilayer core comprises a sheet of cured dielectric material having a layer of metal on each side of the sheet of cured dielectric material, patterning each layer of metal in the plurality of multilayer cores to form wiring traces in each layer of metal, embedding a solder element in at least one sheet of a plurality of sheets of uncured dielectric material and at least one multilayer core, wherein the solder element having a melting point temperature within a temperature range of a curing temperature of the uncured dielectric material, forming a printed circuit board by alternately stacking one of the plurality of multilayer cores with one of the plurality of sheets of uncured dielectric material between each multilayer core, the at least one sheet of the uncured dielectric material having the embedded solder element positioned so as to be aligned with the wiring traces in adjacent layers of metal in adjacent multilayer cores and the at least one multilayer core having the embedded solder element positioned so as to be aligned with the solder element in the adjacent uncured dielectric material, and laminating the stack of multilayer cores and sheets of uncured dielectric material to cause curing of the sheets of uncured dielectric material and melting of the solder element.

BRIEF DESCRIPTION OF THE DRAWINGS

The following detailed description, given by way of example and not intend to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Embodiments of the present invention generally relate to a printed circuit board, and more particularly, to a structure and a method of forming a printed circuit board having buried vias. Generally, a printed circuit board is made up of layers of prepreg and core. A prepreg may be a sheet of uncured dielectric material. A core may be a sheet of cured dielectric material with layers of a metal, such as, for example, copper, on either side. The printed circuit board is made up of stacks of the core with the prepreg sheet separating each core.

The printed circuit board may have many vias, such as, for example, through vias, blind vias, and buried vias. To create a via, such as a through via, a hole may be drilled through the stacks of the core and prepreg layers of the printed circuit board. The hole extends throughout all the stacks of the core and the prepreg layers. The hole may be electroplated or otherwise metalized, creating the through via.

Creating buried vias is more time consuming, expensive, and labor intensive because using conventional processes, most buried vias are first constructed as through vias. For example, the printed circuit board may be made up of three stacks of the core. One stack of the core may be used to create a through via. Once the through via is created, all three stacks of the core are assembled such that the stack with the through via is placed in the middle with each of the remaining two stacks of the core being stacked on top and below the stack with the through via. In addition, in between each stack of the core, the prepreg layer is deposited. The resultant structure is a printed circuit board with a buried via. The buried via is the through via of the one of the three stacks, buried in between the other two stacks of the core.

Buried vias may also be constructed using a solder element in conjunction with the prepreg layer. In that particular method, the solder element is inserted into the prepreg layer before the printed circuit board is constructed. The prepreg layers with the solder elements, along with the stack of cores, are then used to construct the printed circuit board, where each stack of cores is separated by the prepreg layer with the solder element. The resultant structure undergoes a heating process followed by a lamination process. During the heating process, a heat sources, such as, for example, a laser, is used to locally heat the solder elements, melting them. Once the solder element melts and subsequently solidifies, the solder element is the buried via.

After the solder elements are melted, the printed circuit board undergoes a lamination process to laminate the core stacks together with the prepreg. Using this method is requires multiple steps, is challenging, and expensive because the laser must be designed to be used in printed circuit board manufacturing. Accordingly, there exists a need to reduce the manufacturing cost of printed circuit boards with buried vias.

Embodiments of the present invention provide a method of creating buried vias in a printed circuit board that is less expensive, not as time consuming and labor intensive as the conventional process. Embodiments of the present invention provide a method that reduces the number of heating steps needed and does not require special equipment, such as, for example, a laser to heat the solder element, creating the buried via. In addition, the new method does not require the buried via to pass through a core when compared to the conventional method where the buried via must pass through a core. Further, embodiments of the present invention provide a design improvement by allowing blind vias to overlap in a multilayer printed circuit board.

Figure 1:
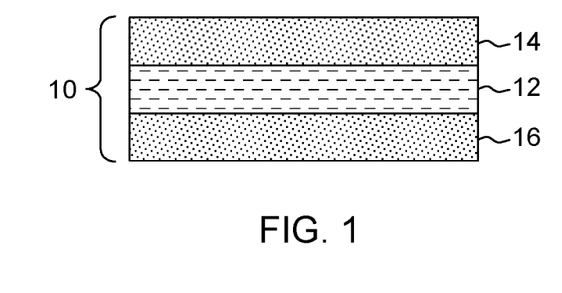
FIG. 1 is a cross section view illustrating a multilayer core of a printed circuit board according to an exemplary embodiment.

Referring now to FIG. 1, a multilayer core 10 is shown, in accordance with an embodiment. The multilayer core 10 may be formed in sheets approximating the size of the finished printed circuit board. Alternatively, the multilayer core 10 may be made larger than the finished printed circuit board and then cut to size. The multilayer core 10 may include a cured dielectric layer 12, a first metal layer 14, and a second metal layer 16.

The cured dielectric layer 12 may be made of any material having a relative permativity (ER) of about 3.2 to 4.8. The cured dielectric layer 12 may be made of uncured dielectric material that has been made rigid through a curing process, thus forming the cured dielectric layer 12. The uncured dielectric material that may be used to form the cured dielectric layer 12 may be made up of woven glass cloth impregnated with and surrounded by resin. One example of a suitable dielectric may be a resin-glass weave, such as, for example, FR4 which may include a woven fiberglass cloth with an epoxy resin binder. Another example of a suitable dielectric may be a resin such as ceramic filled polytetrafluoroethylene (PTFE) composite. The curing of the dielectric material causes the resin to become rigid.

The first metal layer 14 is deposited on the top surface of the cured dielectric layer 12. The second metal layer 16 is deposited on the bottom surface of the cured dielectric layer 12. As a result, the top surface of the cured dielectric layer 12 is in direct contact with the first metal layer 14 and the bottom surface of the cured dielectric layer 12 is in direct contact with the second metal layer 16. Known suitable deposition techniques, such as, for example, atomic layer deposition, chemical vapor deposition, or physical vapor deposition may be used to form the core 10.

The first metal layer 14 and the second metal layer 16 may be made of metal, such as, for example, copper, gold, nickel, gold-nickel alloy, or any other suitable metal. The resultant core 10 includes the cured dielectric layer 12 sandwiched between the first metal layer 14 and the second metal layer 16.

Figure 2:
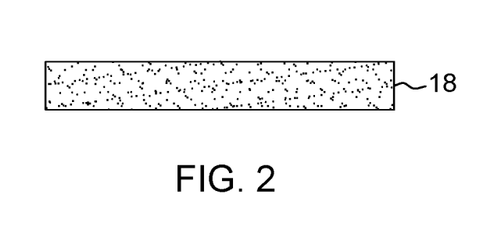
FIG. 2 is a cross section view illustrating a prepreg layer of a printed circuit board according to an exemplary embodiment.

Referring now to FIG. 2, a prepreg layer 18 is shown, in accordance with an embodiment. The prepreg layer 18 may also be referred to as an uncured dielectric layer because the prepreg layer 18 may be made of the same materials that make up the cured dielectric layer 12. Some examples of material that make up the prepreg layer 18 may include, but are not limited to, FR4 which may include a woven fiberglass cloth with an epoxy resin binder, or a ceramic filled PTFE composite. In addition, since the prepreg layer 18 is made of uncured dielectric material, the resin contained in the uncured dielectric material may have the consistency of a highly viscous paste with some stability provided by the glass weave.

Figure 3:
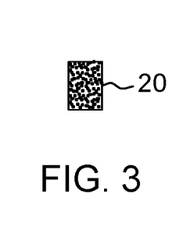
FIG. 3 is a cross section view illustrating a solder element of a printed circuit board according to an exemplary embodiment.

Referring now to FIG. 3, a solder element 20 is shown, in accordance with an embodiment. The solder element 20 may be a homogeneous solder alloy preform that may come in standard shapes such as, for example, squares or rectangles, and which may contain a flux. The composition of the solder element 20 may be selected from a group of alloys. The alloys may have a melting temperature to be within a few degrees of the curing temperature of the prepreg layer 18. For example, the alloy that makes up the solder element 20 may have its melting point within 5° C. of the curing temperature of the prepreg layer 18.

The solder element 20 may also be a solder paste preform. The solder paste preform may contain various elements of the solder alloy and a binder, which may also be the flux. The solder paste may not be previously melted. The solder composition may have a liquidus temperature to be within 5° C. of the curing temperature of the prepreg layer 18. The solder element 20 may be embedded in the prepreg layer 18 during the formation of the printed circuit board.

Embodiments of the invention contemplate using the prepreg layers 18A in conjunction with the solder elements 20. Further, embodiments of the invention contemplate having the solder element 20 made of material whose melting temperature is similar to the temperature range of the curing temperature of the prepreg layer 18. In addition, it is critical that the melting temperature of the solder element 20 is lower than the curing temperature of the prepreg layer 18. Designing the melting temperature of the solder element 20 to be similar to the curing temperature of the prepreg layer 18, while also being lower than the curing temperature of the prepreg layer 18, eliminates the step of heating the solder element 20 using a laser. As a result, a single lamination step can be used to melt the solder element 20 and cure the prepreg layer 18, as will be described in more detail hereafter with respect to FIG. 7.

In an embodiment, the melting temperature of the solder element 20 is similar to the curing temperature of the prepreg layer 18 when the difference between the melting temperature of the solder element 20 and the curing temperature of the prepreg layer 18 ranges from approximately 0° C. to approximately 20° C. For example, in an embodiment, the solder element 20 may be made of material that has a melting point temperature of 185° C. and the prepreg layer 18 may be made of material that has a curing temperature of 205° C.

In another embodiment, the difference between the melting temperature of the solder element 20 and the curing temperature of the prepreg layer 18 may range from approximately 0° C. to approximately 5° C. For example, in an embodiment, the solder element 20 may be made of material that has a melting point temperature of 190° C. and the prepreg layer 18 may be made of material that has a curing temperature of 195° C. The difference between the two temperatures is 5° C. In addition, the melting point of the solder element 20 is lower than the curing temperature of the prepreg layer 18. Having the difference between the melting temperature of the solder element 20 and the curing temperature of the prepreg layer 18 range from approximately 0° C. to approximately 5° C. may shorten the lamination process time. In addition, it may produce buried vias that have better connectivity when compared to the buried vias that are produced when the difference between the two temperatures ranges from approximately 10° C. to approximately 20° C.

Figures 4, 5:
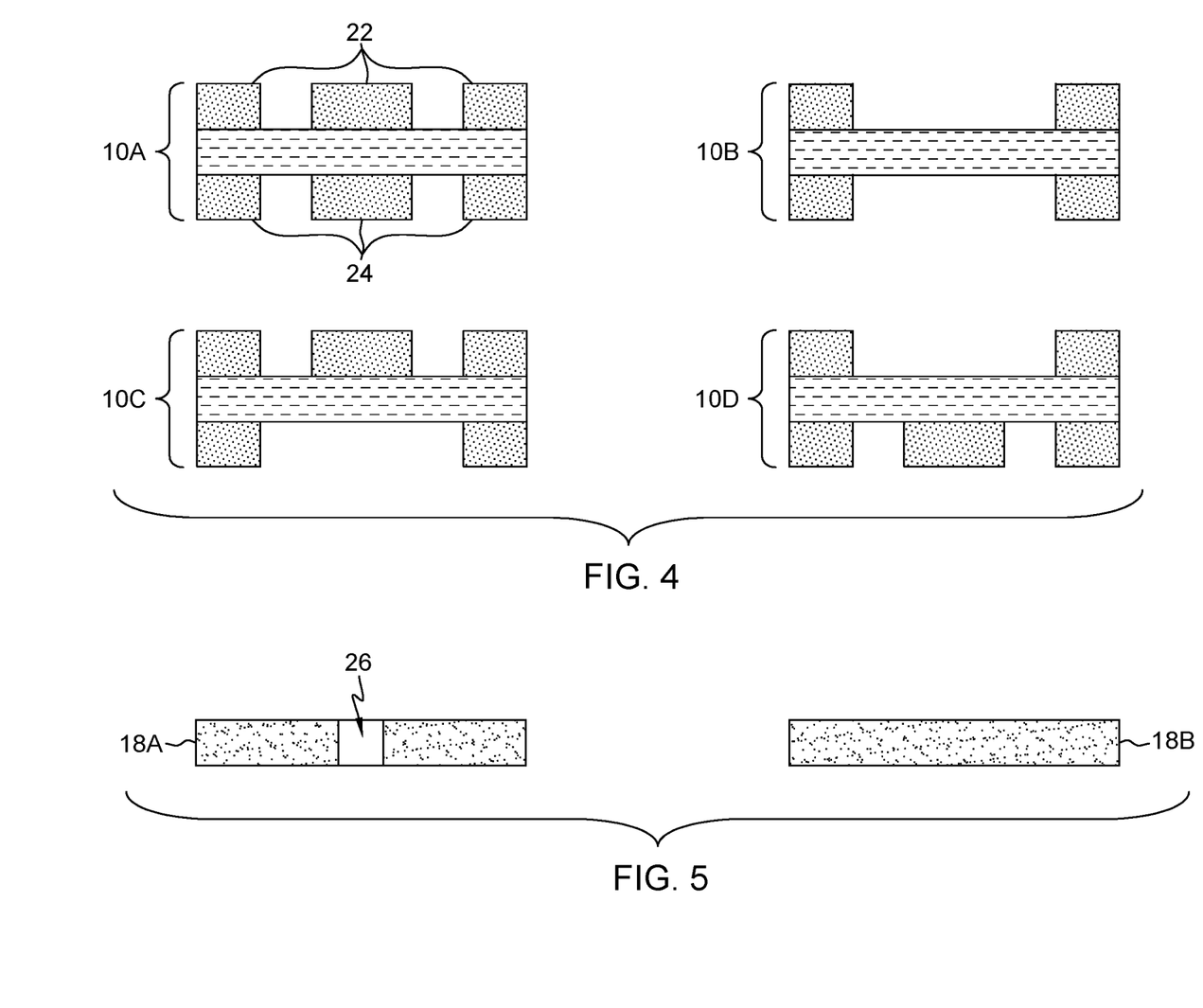
FIG. 4 is a cross section view illustrating several examples of an etched multilayer core according to an exemplary embodiment.
FIG. 5 is a cross section view illustrating two types of prepreg layers according to an exemplary embodiment.

Referring now to FIG. 4, four different multilayer cores 10A, 10B, 10C, and 10D are shown, in accordance with an embodiment. The first metal layer 14 and the second metal layer 16 of the multilayer core 10, illustrated in FIG. 1, may be patterned, using known etching techniques, such as, for example, wet etch, to remove portions of the metal layers 14 and 16. When portions of the metal layers 14 and 16 are etched, wiring traces 22 and 24 are formed. The formation of the wiring traces 22, 24 may vary, depending on the wiring requirements of the printed circuit board.

In order to achieve the desired wiring traces 22, 24, portions of the metal layers 14 and 16 are masked and the remaining unmasked portions of the metal layers 14 and 16 are etched to expose the top and bottom surfaces of the cured dielectric layer 12. It should be understood that even though four different multilayer cores are shown in FIG. 4 in which the wiring on the cured dielectric layer 12 varies, embodiments of the invention are not limited to the four. Other variations of the wiring traces 22, 24 may be contemplated.

Referring now to FIG. 5, two types of prepreg layers 18A and 18B are shown, in accordance with an embodiment. Prepreg layer 18A may have a perforation 26 in it whereas the prepreg layer 18B has no such perforation 26. The perforation 26 may be formed, for example, by drilling the prepreg layer 18B, thus forming prepreg layer 18A. The perforation 26 may extend entirely through the prepreg layer 18A. During the construction of the printed circuit board, the solder element 20 (illustrated in FIG. 3) may be deposited in the perforation 26. As described herein above, the prepreg layers 18A, 18B may be made of uncured dielectric material.

Figure 6:
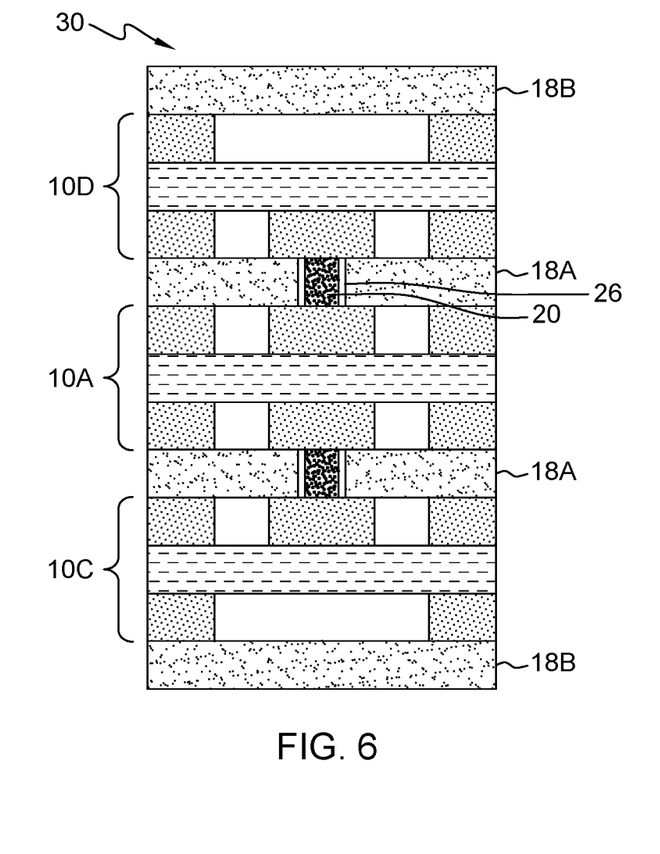
FIG. 6 is a cross section view illustrating cores stacked with prepreg layers according to an exemplary embodiment.

Referring now to FIG. 6, a printed circuit board 30 is shown, in accordance with an embodiment. The printed circuit board 30 may include a plurality of cores 10 and prepreg layers 18. The cores 10 are three examples of the cores illustrated in FIG. 4 and include core 10A, core 10C and core 10D. The cores 10 may be stacked together, one core 10 on top of another core 10 with the prepreg layers 18A interspersed between the cores 10.

In an embodiment, between the multilayer core 10D and the multilayer core 10A, the prepreg layer 18A may be deposited, using known deposition techniques. The perforation 26 of the prepreg layer 18A may be filled by the solder element 20. Similarly, between the multilayer core 10A and the multilayer core 10C, another prepreg layer 18A may be deposited and the perforation 26 of that prepreg layer 18A may again be filled with the solder element 20. The solder element 20 may be positioned in the prepreg layer 18A such that the solder element 20 may be aligned with the wiring traces 22 and 24 in the adjacent layers of the multilayer cores 10.

In an embodiment, the solder elements 20 may entirely fill the perforations 26 in the prepreg layers 18A. In an alternative embodiment, there may be a small gap between the solder element 20 and the prepreg layer 18A.

The prepreg layers 18B may be placed on top of the stack and on the bottom of the stack. As a result, the prepreg layer 18B may be placed on top of the core 10D and another prepreg layer 18B may be placed on the bottom of the core 10C. In an alternative embodiment, the printed circuit board 30 may have both prepreg layer 18A and prepreg layer 18B interspersed between the cores 10.

In an embodiment, the circuit board 30, illustrated in FIGS. 6 to 10, does not call for a core such as core 10B (illustrated in FIG. 4). However, in an alternative embodiment, the printed circuit board 30 may have the core 10B in its stack.

It should be understood that three multilayer cores 10 have been shown in FIG. 6 and subsequent FIGs. for the purpose of illustration and not limitation. The stack for a printed circuit board may contain more or less than the three cores 10. Also, FIG. 6 and subsequent FIGs. show only two solder elements 20 for the purpose of illustration and not limitation. In practice, there may be many more than two solder elements 20 within the printed circuit board 30 including multiple solder elements 20 within each prepreg layer 18A in the printed circuit board 30. Finally, FIG. 6 and subsequent FIGs. show the solder elements 20 being vertically aligned for the purpose of illustration and not limitation. As there is expected in practice to be many more solder elements, it is expected that there may not be vertical alignment between the solder elements 20. In various layers the solder elements 20 may be spaced horizontally with respect to the solder element above or below and may even overlap.

Figure 7:
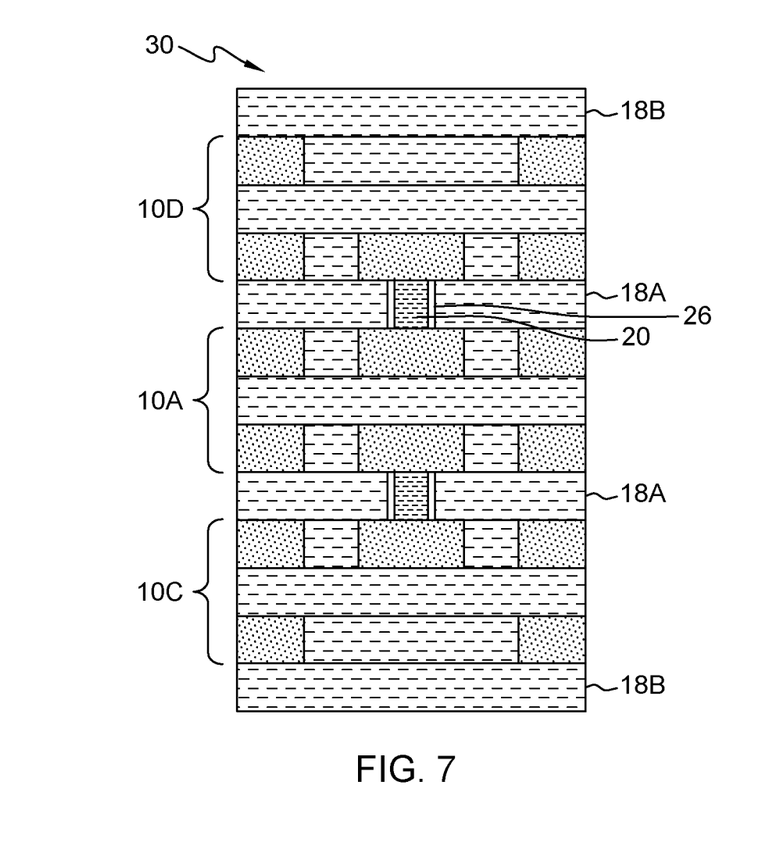
FIG. 7 is a cross section view illustrating the printed circuit board with cured prepreg layers according to an exemplary embodiment.

Referring now to FIG. 7, the printed circuit board 30 is shown after the printed circuit board 30 has undergone a lamination process, in accordance with an embodiment. During the lamination process, heat and pressure are applied to the printed circuit board 30. The printed circuit board 30 gets heated to a temperature that allows for the prepreg layers 18A and 18B to cure and the solder element 20 to melt. During the lamination process, the prepreg layers 18A and 18B are pushed into the gaps between the wiring trances in the metal layers 14 and 16, effectively filling the wiring traces. In addition, the lamination process also heats the solder elements 20 and melts the solder elements 20. The melting of the solder elements 20 creates electrical continuity between the metal traces 22, and 24. Once the lamination process finishes, the solder elements 20 may solidify.

Generally, when using a conventional method of forming a buried via multiple heating steps are required. The lamination process is first preceded by a heating step during which only the solder elements are locally heated by a laser. The heating of the solder elements causes them to melt. Once the laser is removed, the solder elements solidify forming the buried vias. After the formation of the buried vias, the printed circuit board undergoes a lamination process. During the lamination process, the printed circuit board gets heated and pressure is applied to cure the prepreg layers. The lamination process may have an adverse effect on the solidified solder elements causing the solder elements to crack. As a result, the lamination process may be followed by another heating step, during which a laser is used to re-melt the solder elements that may have cracked during the lamination process.

When using the conventional method to form the buried via, the lamination step is followed by localized heating of the solder element using the laser. Placing the laminated printed circuit board in an oven to re-melt the solder element is not beneficial. Since the laminated printed circuit board has layers of cured dielectric and cured prepreg, the printed circuit board cannot be heated to a temperature high enough that may re-melt the solder element because the printed circuit board may burn. As a result, re-melting the solder element after lamination is done using a laser.

A benefit of the embodiments of the present invention is that the printed circuit board 30 undergoes only one heating process, the lamination process, to form the buried via. Since the solder elements 20 melt at a temperature that is close in temperature range to the curing temperature of the prepreg layers 18A and 18B, the printed circuit board 30 undergoes only one heating process. During the lamination process the printed circuit board 30 gets heated and pressure is applied, causing the prepreg layers 18A and 18B to cure and the solder elements 20 to melt. Once the lamination process ends, the solder elements 20 solidify, creating buried vias.

Further, heating the entire printed circuit board 30 during the single lamination process does not necessitate high temperatures because the solder elements 20 and the prepreg layers 18A and 18B may be made of materials whose melting point and curing temperatures, respectively, below 300° C. For example, the melting point of the solder elements 20 and the curing temperatures of the prepreg layers 18A and 18B may be in the range of 180° C.-230° C.

Embodiments of the present invention contemplate matching the melting point temperatures of the solder elements 20 to the curing temperatures of the prepreg layers 18A and 18B. The solder element 20 may not melt faster or slower than the curing of the prepreg layer 18 because that may have an adverse effect on the buried via and the connection it may make with the surrounding layers. As a result, the solder element 20 is made of material that allows for the solder element 20 to melt concurrently with the curing of the prepreg layer 18.

Figure 8:
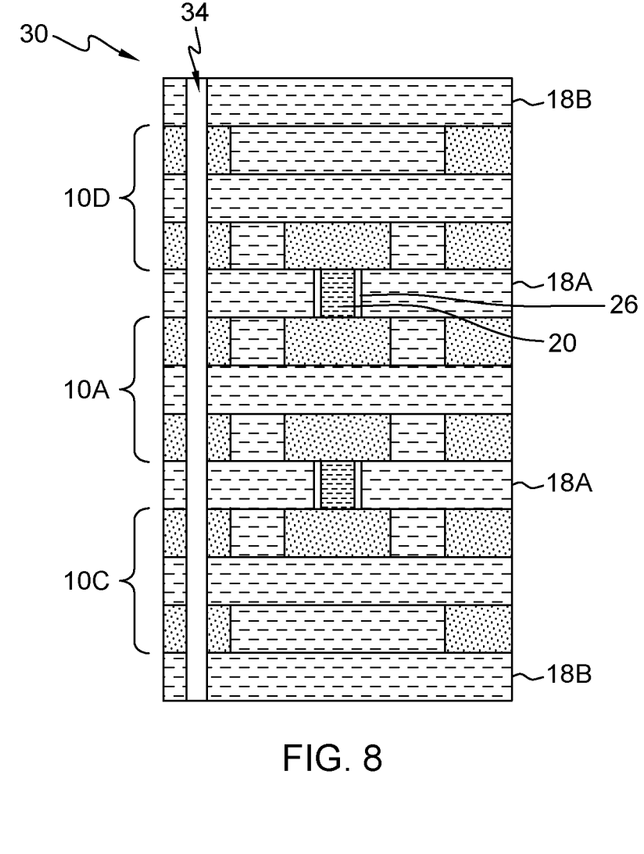
FIG. 8 is a cross section view illustrating forming a through via in the printed circuit board according to an exemplary embodiment.

Referring now to FIG. 8, the printed circuit board 30 that has a through via opening 34 is shown, in accordance with an embodiment. After the lamination process, the through via opening 34 may be formed, for example, by drilling a hole in the printed circuit board 30. The through via opening 34 extends from the top of the printed circuit board 30 to the bottom of the printed circuit board 30. The through via opening 34 may be formed to provide an electrical current between elements connected to the printed circuit board 30.

Figure 9:
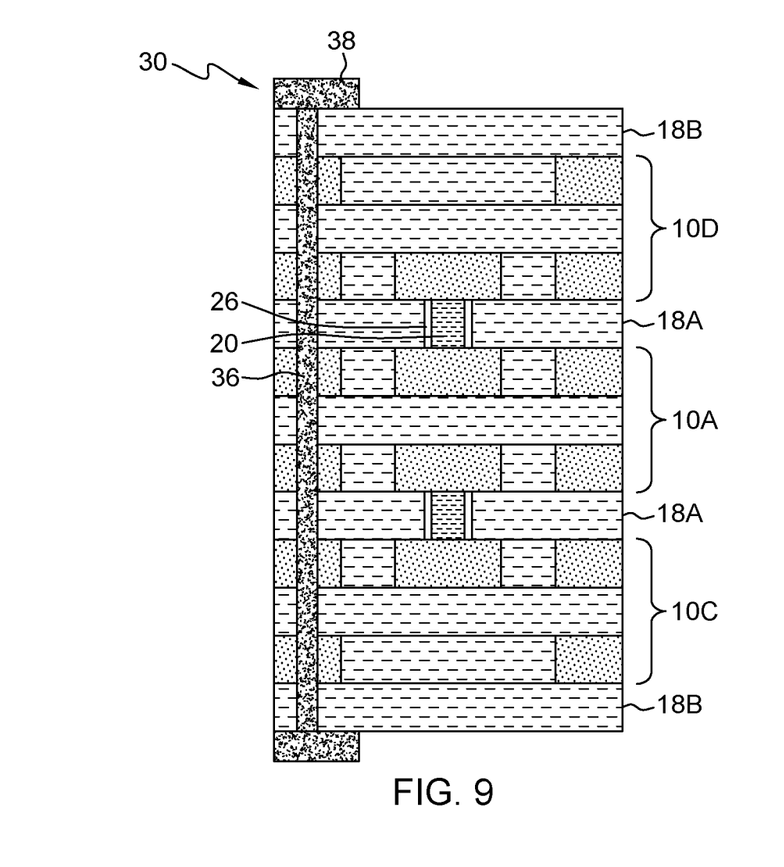
FIG. 9 is a cross section view illustrating metallization of the through via according to an exemplary embodiment.

Referring now to FIG. 9, the printed circuit board 30 with a through via 36 is shown, in accordance with an embodiment. Once the through via opening 34 is formed in the printed circuit board 30, the through via opening 34 may be subsequently plated, with a metal, such as, for example, copper, creating the through via 36. The top portion and the bottom portion of the exposed prepreg layers 18B may also be plated with the same metal as the through via opening 34. Known plating techniques, such as, for example, electroplating, may be used to plate the through via opening 34 and the top and bottom portions of the exposed prepreg layers 18B.

After the top and bottom portions of the exposed prepreg layers 18B are plated, they may be chemically etched to form microstrip features 38. The microstrip features 38 may be subsequently used current paths when other features are connected to the printed circuit board 30.

Figure 10:
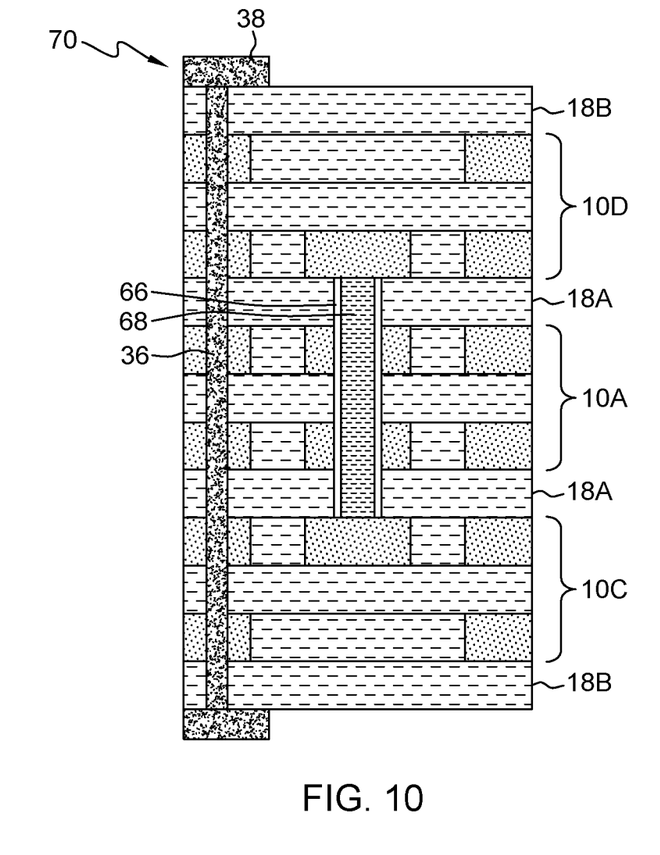
FIG. 10 is a cross section view illustrating an alternative embodiment of a printed circuit board according to an exemplary embodiment.

Referring now to FIG. 10, another exemplary embodiment of a printed circuit board 70 is shown, in accordance with an embodiment. In the prior exemplary embodiment of printed circuit board 30, the perforations 26 and solder elements 20 were only in the prepreg layers 18A and did not extend through any of the cores 10. In the exemplary embodiment of the printed circuit board 70 a perforation 66 and a solder core 68 extend through one or more cores 10 and one or more prepreg layers 18A.

The printed circuit board 70 may be formed in substantially the same way as the printed circuit board 30. The etched cores 10 and the prepreg layers 18A are stacked on top of one another. During the stacking, a hole may be drilled through one of the cores 10 and the surrounding prepreg layers 18A. The hole may be then filled with the solder core 68. Additional cores 10 and prepreg layers 18A or 18B may be deposited on top. The printed circuit board 70 undergoes a lamination process during which the prepreg layers 18A and 18B are cured and the solder core 68 is melted.

As illustrated in FIG. 10, the perforation 66 and the solder core 68 may extend through the core 10A and the surrounding prepreg layers 18A. Having the solder core 68 extend through one of the cores 10 translates to a buried via that may span across multiple inter layers. This allows for multiple layer connectivity.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
   forming a plurality of multilayer cores, each of the plurality of multilayer cores comprising a sheet of cured dielectric material sandwiched between two metal wiring layers;
   embedding a solder element in an uncured dielectric layer, wherein a melting temperature of the solder element matches a curing temperature of the uncured dielectric layer;
   stacking the uncured dielectric layer between two of the plurality of multilayer cores, wherein the embedded solder element is aligned with wire traces of the metal wiring layers of each of the two of the plurality of multilayer cores; and
   simultaneously melting the solder element and curing the uncured dielectric layer by laminating the stacked uncured dielectric layer between the two of the plurality of multilayer cores with a single lamination process,
   wherein melting the solder element and curing the uncured dielectric layer forms an electrical connection between the two multilayer cores and forms a physical connection between the two of the plurality of multilayer cores and the cured dielectric layer.

2. The method of claim 1,
   wherein the simultaneously melting the solder element and curing the uncured dielectric layer by laminating the stacked uncured dielectric layer between the two of the plurality of multilayer cores with a single lamination process is performed without using a laser heating step.

3. The method of claim 1, further comprising:
   forming a through via opening through the stack of two of the multilayer cores and the cured dielectric layer; and
   metallizing the through via opening.

4. The method of claim 1,
   wherein the two metal wiring layers of each of the plurality of multilayer cores are copper.

5. The method of claim 1,
   wherein the solder element comprises solder and a flux.

6. A method comprising:
   forming a plurality of multilayer cores, each of the plurality of multilayer cores comprising a sheet of cured dielectric material sandwiched between two metal wiring layers;
   embedding solder elements in a plurality of uncured dielectric layers, wherein a melting temperature of each of the solder elements matches a curing temperature of each of the uncured dielectric layers;
   alternately stacking the plurality of multilayer cores with the plurality of uncured dielectric layers, wherein each of the embedded solder elements are aligned with respective wire traces of the metal wiring layers of each of the uncured dielectric layers; and
   simultaneously melting the solder elements and curing the plurality of uncured dielectric layers by laminating the stacked plurality of multilayer cores with the plurality of uncured dielectric layers with a single lamination process and without using a laser heating step,
   wherein melting the solder elements and curing the plurality of uncured dielectric layers forms electrical connections between adjacent multilayer cores of the stacked plurality of multilayer cores and forms physical connections between the plurality of multilayer cores and the cured dielectric layers.

7. The method of claim 6, further comprising:
   forming a through via opening through the stack of the plurality of multilayer cores and the cured dielectric layers; and
   metallizing the through via opening.

8. The method of claim 6,
   wherein the two metal wiring layers of each of the plurality of multilayer cores are copper.

9. The method of claim 6,
   wherein the solder elements each comprise solder and a flux.

10. A method comprising:
    forming a plurality of multilayer cores, each of the plurality of multilayer cores comprising a sheet of cured dielectric material sandwiched between two metal wiring layers;
    embedding a solder element in an uncured dielectric layer;
    stacking the uncured dielectric layer between two of the plurality of multilayer cores, wherein the embedded solder element is aligned with wire traces of the metal wiring layers of each of the two of the plurality of multilayer cores; and
    simultaneously melting the solder element and curing the uncured dielectric layer by laminating the stacked uncured dielectric layer between the two of the plurality of multilayer cores with a single lamination process and without using a laser heating step,
    wherein melting the solder element and curing the uncured dielectric layer forms an electrical connection between the two multilayer cores and forms a physical connection between the two of the plurality of multilayer cores and the cured dielectric layer.

11. The method of claim 10, further comprising:
    forming a through via opening through the stack of the two of the plurality of multilayer cores and the cured dielectric layer; and
    metallizing the through via opening.

12. The method of claim 10,
    wherein the two metal wiring layers of each of the plurality of multilayer cores are copper.

13. The method of claim 10,
    wherein the solder element comprises solder and a flux.

14. The method of claim 10,
    wherein the solder element has a melting temperature within 5° C. of a curing temperature.

15. The method of claim 10, wherein the solder element has a melting temperature below a curing temperature of the uncured dielectric layer.

* * * * *